Aug. 10, 1965 R. A. SKINNER 3,200,343
D.C. AMPLIFIER HAVING FAST RECOVERY CHARACTERISTICS
Filed Dec. 29, 1961
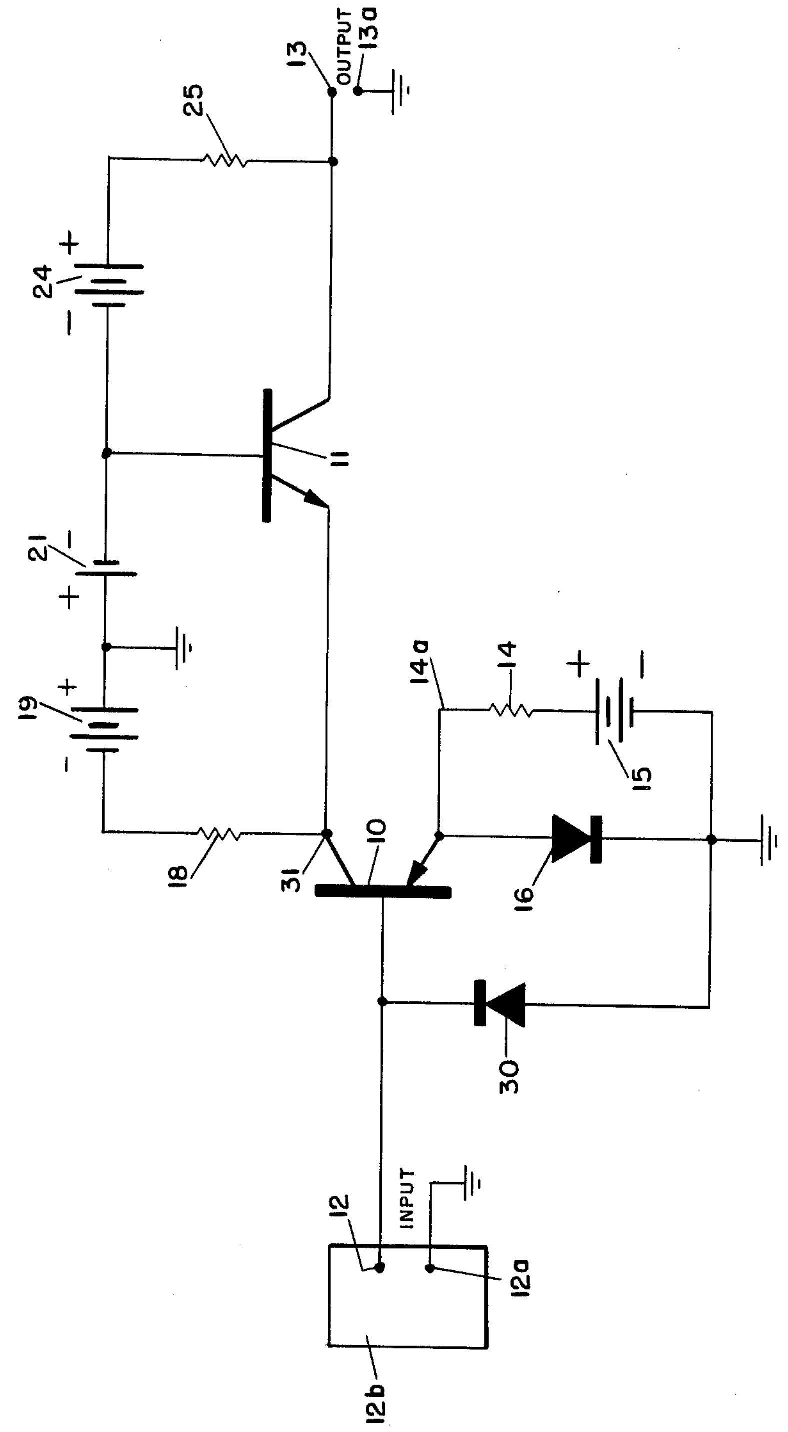

United States Patent Office 3,200,343

Patented Aug. 10, 1965

3,200,343

D.C. AMPLIFIER HAVING FAST RECOVERY CHARACTERISTICS

Richard A. Skinner, Philadelphia, Pa., assignor to Leeds and Northrup Company, Philadelphia, Pa., a corporation of Pennsylvania Filed Dec. 29, 1961, Ser. No. 163,232
11 Claims. (Cl. 330—17)

This invention relates to amplifying circuits and has for an object the provision of a high gain transistor amplifier which functions below the saturation range of its transistors and has a minimized value of internal high frequency feedback.

Amplifiers using transistors as their active elements are known by those skilled in the art to be limited in their applications because they are unsuited for applications where the input signals vary over wide ranges in magnitude and where the speed of response to the input signals must be quite high. In such applications, when the input signals are of a high forward biasing value, the transistors become "overloaded" or saturated. A transistor may be defined as being saturated when its collector-base junction is forward biased at the same time that its emitter-base junction is forward biased. Upon removal of the high value input signal, many of the current carriers (commonly known as stored charge) will be trapped in the base region of the transistor. These trapped carriers will block the transistor and prevent amplification of subsequent input signals until these carriers can be "swept out." Such "sweeping" time duration presents an undesirable time delay and results in a low speed of response and slow recovery from the high valued input signals.

In addition, prior transistor amplifiers have been limited in their applications because having a substantially low value of cutoff frequency. Though a transistor itself may have high gain capabilities (Beta) in the high frequency range, the foregoing low cutoff frequency results when the transistor is included in an amplifier circuit which causes excessive internal high frequency feedback because of high values of collector resistance and high values of capacitance developed between collector and base of the transistor. During operation of known transistor amplifiers for differing values of input signals, the conductivity of the transistor will vary producing a varying collector potential. With the transistor highly conductive, the potential difference between its collector and base will be relatively small and a large effective value of feedback capacitance is developed. In addition, conventional transistor amplifiers have required for operation a large value of collector resistance. As a result of the foregoing large value of collector resistance and large value of capacitance between collector and base, there will be developed a high level of internal high frequency feedback resulting in a low cutoff frequency for the transistor amplifier, i.e. low gain for frequencies above the low cutoff frequency.

In accordance with the present invention, there is provided a transistor amplifier (1) which is prevented from reaching the saturation limits of its transistors and (2) has a minimized value of high frequency feedback.

In carrying out the invention in one form thereof, the transistor amplifier comprises a normally conductive output transistor and an input transistor having an input circuit for applying thereto an input signal which may vary over a wide range of magnitude and may contain high frequency components. The emitter of the output transistor is connected to the collector of the input transistor and the input transistor has an output circuit which includes a resistor connected between its collector and ground. A source of constant current is connected between ground and the emitter of the input transistor. That constant current source, for a selected maximum conductivity of the input transistor, limits the maximum value of current supplied by it to the input transistor by way of its emitter to a value below the saturating range of that transistor for the wide range of input signal amplitude. A unidirectional device is connected in shunt with a constant current source for bypassing the difference between the magnitude of the constant current from the constant current source and the emitter current of the input transistor for all values of conductivity below the aforesaid selected maximum value. For those lower values of conductivity, the emitter of the input transistor will be maintained at a low impedance with respect to ground and thus the input transistor will provide gain of a high order of magnitude for the lower amplitude signals.

Further in accordance with the invention, there is provided a loop circuit for the output transistor which includes the resistor and the ground connection in the output circuit of the input transistor and also includes the base and emitter of the output transistor. A first source of supply is included in the loop circuit and is disposed on the resistor side of the ground connection. The first source of supply has a polarity which normally maintains the output transistor conductive. A second source of supply is connected in the loop circuit between the ground connection and the base of the output transistor for establishing the collector of the input transistor at a relatively high potential with respect to ground, thereby to produce a minimum capacitance between said last-named collector and its base to minimize high frequency feedback to the input circuit of the input transistor. The part of a loop circuit extending from the collector of the input transistor by way of the emitter and base of the normally conductive output transistor and by way of the second source of supply provides a low impedance path to ground for high frequencies thereby further to minimize the high frequency feed back. Both the minimization of effective collector-emitter capacitance and the provision of said low impedance path maintain high gain over an extended range of frequencies.

The output circuit of the output transistor includes a source of supply which, for all outputs of the input transistor, limits the operation of the output transistor to a range below saturation thereof.

For a more detailed disclosure of the invention and for further objects and advantages thereof, reference is to be had to the following description taken in conjunction with the accompanying drawing in which there is schematically illustrated a transistor amplifier embodying the invention.

Referring now to the drawing, the invention in its preferred form has been shown as an amplifier comprising an input transistor 10 of the PNP type and an output transistor 11 of the NPN type. Signal input terminal 12 is connected to the base of input transistor 10, the emitter of which is connected by way of resistor 14 to the positive side of battery 15 which has its negative side connected to ground. The resistor 14 and battery 15 are shunted by a diode 16 having its anode connected to the emitter of transistor 10 and its cathode to ground. The collector of transistor 10 and the emitter of transistor 11 are connected together and to one side of resistor 18; the other side of resistor 18 is connected to the negative side of battery 19 or equivalent D.C. voltage source. The positive side of battery 19 is connected to ground. It is to be understood that ground potential will be taken as zero while such ground potential may be at the potential of earth or at a reference potential with respect to earth.

In operation of the transistor amplifier, input signals are applied to the input terminal 12 and to the grounded input terminal 12*a* by the input source shown by the rectangle 12*b*, and output signals are produced at the output terminals 13 and 13*a*. When the input signals applied to terminal 12 are of negative polarity with respect to the grounded terminal 12*a*, the emitter-base junction of input transistor 10 is forward biased and that transistor is rendered conductive. Diode 30 is connected between the base of the transistor 10 and ground and is effective when rendered fully conductive by negative input signals to limit the maximum negative potential that may be developed at the base of transistor 10 with respect to ground. While the input signals may not be of sufficient negative magnitude to render fully conductive diode 30, they still may be of sufficient value to saturate transistor 10 except for the provision of the means which limits the maximum value of current supplied to the input transistor 10 by way of its emitter to a value below the saturation range of that transistor. Specifically, for a selected maximum conductivity of transistor 10, a constant current source formed by battery 15 and resistor 14 provides a constant current which limits the maximum value of current supplied by way of conductor 14*a* to the emitter of transistor 10. In this manner, the emitter current of transistor 10 is limited to a value substantially equal to the constant current preselected by the voltage of battery 15 and the value of resistor 14. Since the collector current of transistor 10 is approximately equal to its emitter current, the collector current will be limited to a value approximately equal to the constant current. Thus, the emitter current and the collector current of transistor 10 are limited in magnitude when input signals are applied to the input terminals 12 and 12*a* having values just sufficiently high to develop the preselected maximum conductivity of input transistor 10. For still higher valued negative input signals, of insufficient magnitude to render diode 30 fully conductive, the foregoing limited magnitude emitter and collector currents will increase but by negligible amounts.

For negative input signals which produce conductivity of transistor 10 below the aforesaid selected maximum value, the emitter current of transistor 10 will be of a lower order of magnitude than the magnitude of the constant current developed by battery 15 and resistor 14. The difference between the magnitude of the constant current and the emitter current will render diode 16 conductive and will flow therethrough to ground and to the negative side of battery 15. Thus, it will be seen that the portion of constant current in excess of the emitter current is bypassed to ground. With diode 16 conductive, the emitter of transistor 10 will be maintained at a relatively low impedance with respect to ground and thus that transistor will exhibit the characteristics of a common-emitter connected transistor. In its common-emitter connection transistor 10 provides large current gain as described in detail in the "Handbook of Semiconductor Electronics," edited by Lloyd P. Hunter, McGraw-Hill, 1956, at Chaper 11, page 20 et seq. Thus, for lower level negative input signals, the diode 16 is effective to convert the input transistor circuit to one affording high gain and without possibility of saturation.

It will be understood that the gain of input transistor 10 is maintained at the foregoing high level as long as the diode 16 is conductive to provide a low impedance path from the emitter to ground. That high gain will only be reduced upon application of negative input signals which result in the conductivity of transistor 10 reaching its preselected maximum value. At such input level, the emitter current of transistor 10 will become substantially equal in value to the constant current and the diode 16 will be rendered nonconductive. With diode 16 nonconductive, the path from the emitter of transistor 10 to ground is at a high impedance because the path includes the resistor 14. As a result of that high impedance in its emitter circuit, transistor 10 is highly degenerative and thus operates in manner similar to that of an emitter-follower.

When the input signals applied to input terminal 12 are of positive polarity with respect to the grounded input terminal 12*a*, the input transistor 10 is rendered nonconductive, the emitter-base junction of that transistor is thus reverse-biased and the emitter and collector currents are reduced to zero as a limit. At that time, all of the constant current from the constant current source will flow by way of conductor 14*a* through the diode 16 to ground and to the negative side of battery 15.

With reverse-biasing input signals, the potential at the emitter of transistor 10 will be maintained at a low fixed value of potential with respect to ground. With forward-biasing negative input signals, the emitter-base junction thereof will provide a relatively small potential drop of substantially constant magnitude and thus the potential developed at the emitter of transistor 10 with respect to ground will vary directly with the input signal potential applied to its base. Since diode 30 is connected between that base and ground, the maximum potential therebetween is held to relatively low order of magnitude with respect to ground. Therefore, the excursion of the base to ground potential is held within a relatively small range of amplitudes, as for example 0–½ volt, which range is sufficient to produce the desired operation of transistor 10. As a result of the small range of variations in potential at the base of transistor 10, the emitter potential will also vary over a small range. The battery 15 is selected to have a potential substantially high with respect to the small range of potential variations at the emitter and with that value of battery 15, the value of resistor 14 is selected to be of suitably high magnitude to provide a constant current having the above-described limited value. In this manner, as the potentials at the base and at the emitter of transistor 10 vary within their limited range, the current as supplied by the relatively high-voltage battery 15 and as limited by the resistor 14 will remain substantially constant.

The battery 21 connected between the base of output transistor 11 and ground is included in a loop circuit for that transistor which comprises the base and emitter thereof, resistor 18 included in the collector circuit of input transistor 10 and batteries 19 and 21. The loop circuit has a ground connection between batteries 19 and 21. The battery 19 is connected in the loop circuit in a direction corresponding with forward bias for transistor 11 while the battery 21 is connected in a direction corresponding with reverse bias for transistor 11. Battery 19 is selected to have a potential larger than that of battery 21 to provide a resultant forward bias for transistor 11 for all values of collector current of transistor 10 including zero thereby to maintain that transistor normally conductive, i.e., conductive at all times. In this manner, the output transistor 11 is conductively biased at a predetermined point on its operating characteristic in the absence of any collector current of input transistor 10.

With transistor 11 maintained normally conductive, its forward-biased emitter-base junction provides a relatively small resistance. Since point 31 of the loop circuit is connected by way of the low valued emitter-base resistance of transistor 11 to the negative side of battery 21 and the positive side thereof is connected to ground, point 31 is maintained at approximately the negative potential of battery 21 with respect to ground. In this manner, since point 31 is connected to the collector of transistor 10, that collector is maintained at a substantially constant negative potential with respect to ground which is a necessary requirement for proper operation of transistor 10. A positive polarity at that collector would result in saturation of transistor 10. In addition, battery 21 is selected to have a relatively high potential so that the aforesaid collector is maintained at a relatively high constant D.C. potential with respect to ground. It will now be shown that as a result of that high negative potential established between the collector of transistor 10 and ground, the effective capacitance produced between that collector and its base is minimized.

With input transistor 10 conductive, it will be remembered that the potential that may be developed between its base and ground varies over a small range and is of relatively low order of magnitude. Since the collector of transistor 10 is maintained at a substantially high constant negative D.C. potential with respect to ground and since the base is maintained at a low order of potential with respect to ground, the D.C. potential difference between that collector and its base will be maintained at a substantially high constant value. As described in the above-cited "Handbook of Semiconductor Electronics" at Chapter 4, page 25 et seq., the effective capacitance between collector and base of a transistor is inversely proportional to the potential developed therebetween. As a result of the foregoing, the capacitance between the collector and base of transistor 10 will be of a substantially low constant value thereby to minimize internal high frequency feedback from point 31 to the input circuit of transistor 10. It will now be shown that the aforesaid feedback is further minimized by the provision of a low impedance path to ground for high frequencies.

As above described, the forward-biased emitter-base junction of transistor 11 provides a relatively small resistance. Accordingly, for high frequencies or high frequency components, the point 31 is connected to ground by way of a low impedance path which may be traced through the emitter-base junction of transistor 11 and through the battery 21 (having a low impedance at high frequencies) to ground. The collector of transistor 10 is connected to point 31 and thus the collector resistance with respect to ground is also of a low order of magnitude and is maintained constant. As a result of this small collector resistance, the high frequency potential drop developed across that resistance, i.e., the high frequency potential drop between point 31 and ground, will also be of a relatively low order of magnitude. Since there is only a relatively small value of high frequency signal available at point 31 for feedback from the collector of transistor 10 to its base, the small value of collector resistance is effective further to minimize the high frequency feedback.

It will now be understood how the foregoing low effective value of collector to base capacitance in conjunction with the low value of collector resistance of transistor 10 greatly minimize the high frequency feedback from point 31 to the input circuit of transistor 10. It is in this manner that the high gain capabilities of transistor 10 are extended for a wide range of frequencies extending into the high frequency range.

There will now be described the effects on the above-mentioned loop circuit as the collector current of transistor 10 varies for varying input signals. As that collector current increases, the current flowing through resistor 18 increases and the potential drop across that resistor also increases. However, at that time the potential at the point 31 will change in a positive direction and the output transistor 11 will be less conductively biased resulting in a decrease in the flow of its emitter current. Thus, as the collector current of transistor 10 increases, the emitter current of transistor 11 decreases so that the total current flowing through resistor 18 is maintained at approximately a fixed level. In this manner, the collector current of transistor 10 adds to the emitter current of transistor 11 to produce the resultant current flowing through resistor 18.

The emitter current of transistor 11 will be approximately equal to its collector current and that collector current will flow from the positive side of battery 24 through resistor 25 to the collector thereof. The battery 24 and resistor 25 are selected so that for all values of collector current of transistor 10 including zero and for all values of current flowing through resistor 18, the transistor 11 is not operated within its saturation range. Thus, not only input transistor 10 but also output transistor 11 are prevented from operating in their saturation range.

With the foregoing connection to the collector of transistor 11 in conjunction with the connections of the loop circuit to the base and emitter thereof, the output transistor 11 is operated in the common-base configuration.

It will now be understood that upon application of a negative input signal producing the selected maximum conductivity of transistor 10, the collector current of that transistor will be at its maximum value and thus the emitter current of output transistor 11 will be at its lowest order of magnitude. Thus, there will be developed a collector current for transistor 11 of lowest order of magnitude. As a result, the output terminal 13 which is connected to the collector of transistor 11 will be at its highest positive potential with respect to its grounded output terminal 13*a*.

In similar manner, upon application of an input signal producing a small collector current of transistor 10, the emitter current of transistor 11 will be of a high order of magnitude. Thus, there will be developed a relatively high collector current for transistor 11. As a result, the potential drop across the resistor 25 will be of a high order of magnitude and the output terminal 13 will be at a high negative potential with respect to its grounded output terminal 13*a*.

It will now be understood how the transistor amplifier comprising input transistor 10 and output transistor 11 reverses in phase or inverts the output signal relative to the input.

By way of example of suitable components and circuit parameters, when the input transistor 10 is of the PNP type 2N504 of the Philco Corporation and the output transistor 11 is of the NPN type N–101 of Texas Instrument Corp., the other suitable components may be:

| | |
|---|---|
| Diode 16 | S669G Transitron. |
| Diode 30 | IN 625. |
| Resistor 14 | 15K ohms. |
| Resistor 18 | 11K ohms. |
| Resistor 25 | 2K ohms. |
| Battery 15 | 18 volts. |
| Battery 19 | 30 volts. |
| Battery 21 | 7 volts. |
| Battery 24 | 7 volts. |

Although the principles of the invention have been explained by reference to a preferred amplifier circuit, it will be understood that the invention comprehends many modifications of such circuit. For example, output transistor 11 may be of the PNP type and with such change the polarity of the battery 19 will be reversed to maintain transistor 11 normally conductive. In addition, the polarity of the battery 24 will also be reversed to provide a source of negative potential for the collector of transistor 11. With such changes, resistor 18 will be of a higher value than above indicated and it will be understood that the current flow through that resistor will be of low order of magnitude.

In further modifications of the invention, both transistors 10 and 11 may be of the NPN type or transistor 10 may be of the NPN type while transistor 11 may be of the PNP type. With the foregoing changes in the types of transistors 10 and 11, corresponding changes will be made in the polarity of the sources of supply 15, 19, 21 and 24, in the value of resistor 18 and in the connections of the terminals of the diodes 16 and 30 to establish the conductive states of the transistors and diodes above described to preclude saturation for a wide range of input signal levels and to minimize high frequency feedback.

I claim:

1. A transistor amplifier comprising an input transistor, an input circuit normally connected between the base and emitter of said input transistor for applying thereto an input signal, a normally conductive output transistor, the emitter of said output transistor being connected to the collector of said input transistor, said input transistor having an output circuit including a resistor connected between the collector thereof and ground, a source of constant current connected between ground and the emitter of said input transistor which source for a selected maximum conductivity of said input transistor limits the maximum value of current supplied to said transistor by way of said emitter to a value below the saturating range of said input transistor, a unidirectional conductive device connected in shunt with said constant current source for bypassing the difference between the magnitude of said constant current from said constant current source and the emitter current of said input transistor for all values of conductivity below said selected maximum value, a loop circuit for said output transistor including said resistor and the base and emitter of said output transistor, that part of said loop circuit extending from said collector of said input transistor by way of the emitter and base of said output transistor providing a low impedance path to ground for high frequencies, sources of supply included in said loop circuit, one disposed on the resistor side of said ground connection and having a polarity which normally maintains said output transistor conductive and the other of said sources being connected in said loop circuit between said ground connection and said base of said output transistor for establishing said collector of said input transistor at a relatively high potential with respect to ground thereby to produce a minimum capacitance between said last-named collector and its base to minimize high frequency feedback to the input circuit of said input transistor, and an output circuit including a source of supply for said output transistor, said output circuit being connected between the base and collector of said output transistor for delivering output signals upon application of input signals to said input circuit.

2. The transistor amplifier of claim 1 in which said constant current source comprises in series a source of voltage and an additional resistor and in which said source of voltage has a potential substantially high with respect to the variations in potential developed at said emitter of said input transistor.

3. The transistor amplifier of claim 1 in which said source of supply for said output transistor comprises in series a source of voltage and an additional resistor for preventing saturation of said output transistor for all outputs of said input transistor.

4. The transistor amplifier of claim 1 in which one of said transistors is of the PNP type and the other of said transistors is of the NPN type.

5. The transistor amplifier of claim 1 in which said unidirectional conductive device comprises a diode.

6. The transistor amplifier of claim 5 in which there is provided an additional diode connected between said base of said input transistor and ground to limit the maximum potential that may be developed at said last-named base with respect to ground.

7. A transistor amplifier comprising an input circuit connected between the base of an input transistor and reference potential, a constant current circuit connected between said reference potential and the emitter of said input transistor, said circuit including in series a source of voltage and a resistor to limit the maximum emitter current of said input transistor for a selected maximum conductivity thereof to values below saturation of said input transistor, a diode connected between said emitter and said reference potential and poled to provide a conductive path from said emitter to ground for all values of conductivity below said selected maximum value and becoming substantially nonconductive for said selected maximum value of conductivity, the collector of said transistor being coupled to the output of said amplifier, means connected between said collector and said reference potential for (1) maintaining at high frequencies the collector of said input transistor at a low impedance with respect to said reference potential and (2) producing a minimum capacitance between said collector and its base, thereby to minimize high-frequency feedback to said input circuit.

8. The transistor amplifier of claim 7 in which the collector of said input transistor is connected to said reference potential through an additional resistor and also to the emitter of an output transistor and a source of supply connected to the base of said output transistor, connections forming a series circuit between said source of supply, the base and emitter of said output transistor and said additional resistor, both ends of said series circuit being connected to reference potential to form a loop circuit to maintain said output transistor conductive at all times thereby to minimize the high-frequency feedback from collector to base of said input transistor, the collector of said output transistor being connected in an output circuit for delivering output signals upon application of input signals to said input circuit.

9. The transistor amplifier of claim 8 in which said source of supply comprises a first and a second source of voltage, said first source of voltage being connected in said loop circuit between said resistor and said reference potential and having a polarity which normally maintains said output transistor conductive, said second source of voltage being connected in said loop circuit between said base of said output transistor and said reference potential for (1) providing a low impedance path to ground for high frequencies; and (2) establishing said collector of said input transistor at a relatively high potential with respect to ground thereby to produce a minimum capacitance between said last-named collector and its base whereby there is minimized high-frequency feedback to said input circuit.

10. The transistor amplifier of claim 9 in which there is provided an additional diode connected between said base of said input transistor and said reference potential for limiting the maximum potential that may be developed at said last-named base.

11. A transistor amplifier comprising an input transistor connected in grounded emitter configuration, an input circuit normally connected between the base and emitter of said input transistor, a constant current circuit connected between a reference potential and the emitter of said input transistor, said circuit including in series a source of voltage and a resistor to limit the maximum emitter current of said input transistor for a selected maximum conductivity thereof to values below saturation of said input transistor, a load resistor connected to the collector of said input transistor, an output transistor, a source of biasing potential connected between said reference potential and the base of said output transistor, to maintain the base-emitter junction of said output transistor conductive, a series loop circuit including at least the following in the order named: a first terminal of said load resistor, the base-emitter junction of said output transistor, said source of biasing potential, said reference potential and the other terminal of said load resistor, so that the voltage between said reference potential and the base of said output transistor is effective to maintain, through the conductive base-emitter junction of said output transistor, the collector of the input transistor at a high potential and low impedance relative to said reference potential, and an output circuit including a source of supply for said output transistor, said output circuit being connected between the base and collector of said output transistor for delivering output signals upon application of input signals to said input circuit.

References Cited by the Examiner

UNITED STATES PATENTS 2,583,345 1/52 Schade ______________ 330—142 X

ROY LAKE, *Primary Examiner.*

NATHAN KAUFMAN, *Examiner.*